(12) United States Patent
Fang

(10) Patent No.: US 6,236,697 B1
(45) Date of Patent: May 22, 2001

(54) CLOCK RECOVERY FOR MULTIPLE FREQUENCY INPUT DATA

(75) Inventor: Al X. Fang, Suwanee, GA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/085,841

(22) Filed: May 28, 1998

(51) Int. Cl.[7] ........................................ H03D 3/24
(52) U.S. Cl. ................................ 375/376; 331/25
(58) Field of Search ........................ 375/354, 373, 375/374, 375, 376; 331/25, 46; 348/731, 732; 370/503

(56) References Cited

U.S. PATENT DOCUMENTS

| Re. 34,317 | * | 7/1993 | Ikeda | 331/25 |
|---|---|---|---|---|
| 3,993,868 | * | 11/1976 | Balcewicz | 375/274 |
| 4,912,566 | * | 3/1990 | Tasaka | 358/451 |
| 5,671,258 | | 9/1997 | Burns et al. | 375/359 |
| 5,689,692 | | 11/1997 | MacTaggart et al. | 395/558 |
| 6,094,236 | * | 7/2000 | Abe et al. | 348/731 |

* cited by examiner

*Primary Examiner*—Stephen Chin
*Assistant Examiner*—Chieh M. Fan
(74) *Attorney, Agent, or Firm*—Myers Bigel Sibley & Sajovec

(57) ABSTRACT

Clock recovery circuits and methods include a first phase locked loop that generates a control signal in response to a reference clock. A pulse generating and delaying circuit is responsive to the input data signal to generate from the input data signal pulses of predetermined width that are delayed by a predetermined delay. A second phase locked loop is responsive to the control signal, to the pulse generating and delaying circuit and to a mode signal, to generate a clock signal from the input data signal. Accordingly, only the first phase locked loop need include a reference clock. Moreover, in an integrated circuit that includes multiple data ports, only the pulse generating and delaying circuit and the second phase locked loop may need to be duplicated for each data port, to allow each data port to operate at a frequency that is independent of the other data ports. A common first phase locked loop, including a common reference clock, may provide a common control signal to all data ports.

29 Claims, 7 Drawing Sheets

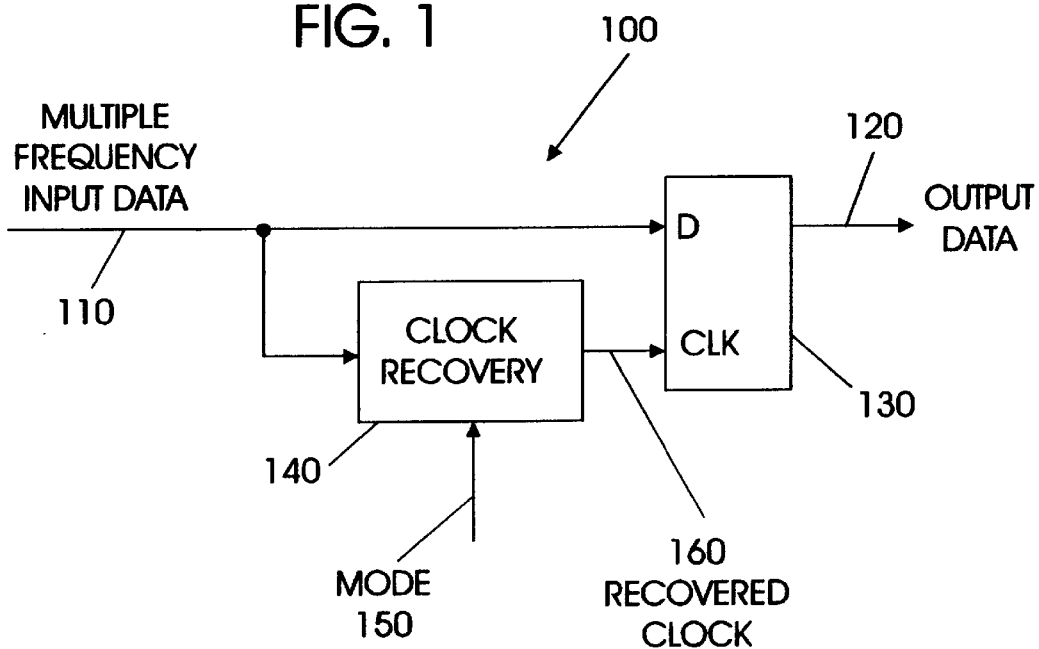
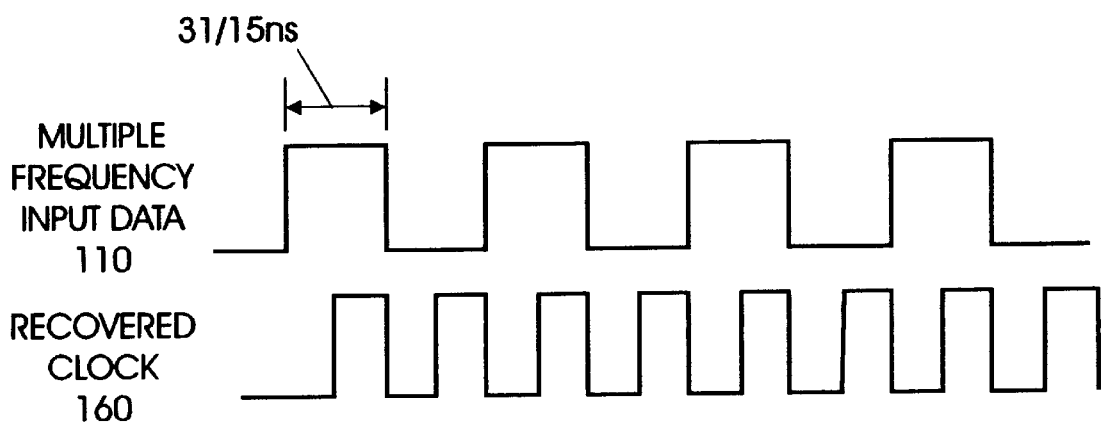

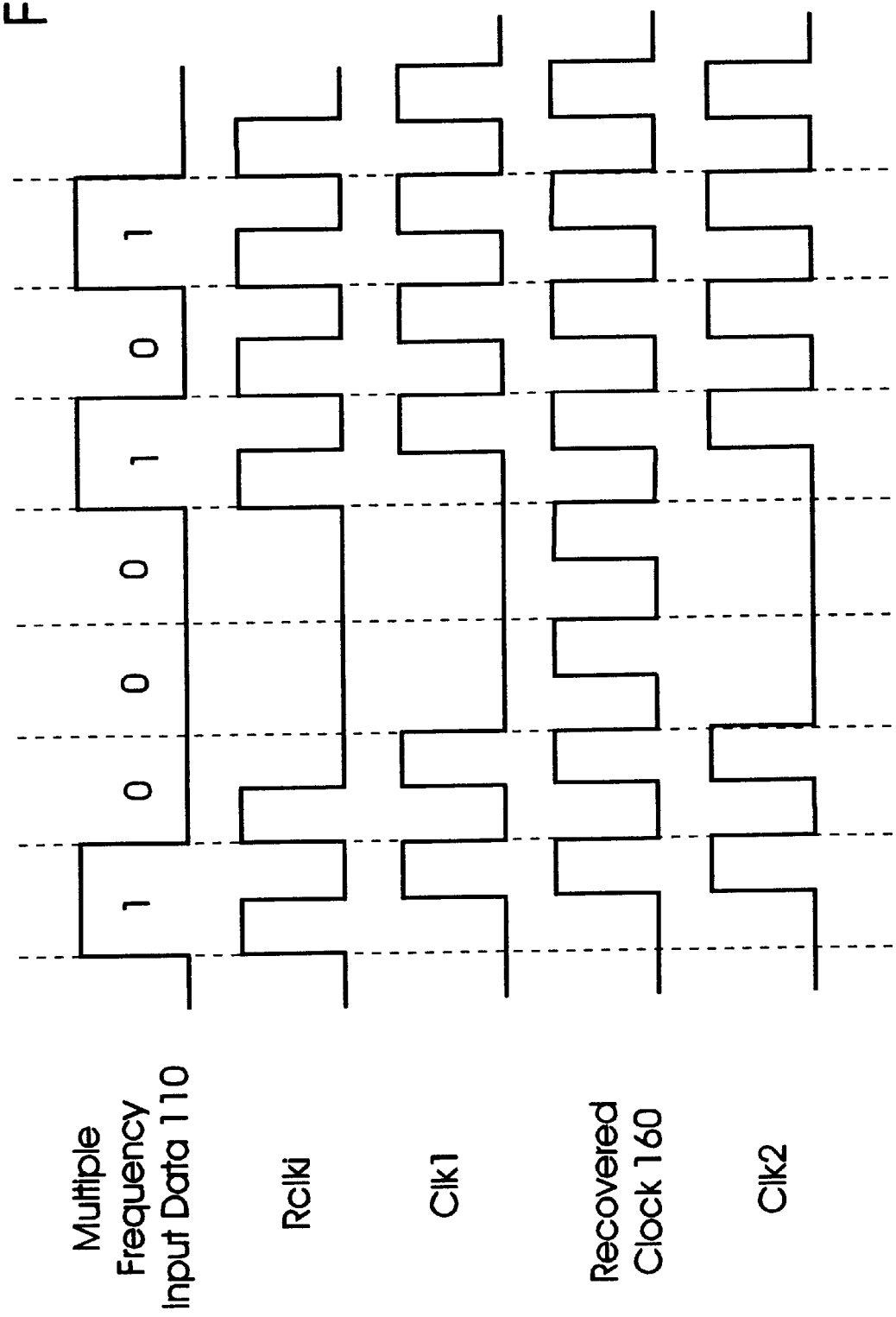

CLOCK RECOVERY FOR MULTIPLE FREQUENCY INPUT DATA

Field of the Invention

This invention relates to data communication circuits and methods, and more specifically to circuits and methods for receiving digital data.

BACKGROUND OF THE INVENTION

Digital data is commonly transmitted and received between different data processing systems via electronic signals. Many data transmission formats include a clock that is separately transmitted with the data. Other data transmission formats are self-clocking, because every clock period includes a signal transition. Many other types of data transmissions are not self-clocking because they encode data as a series of high and low pulses of varying duration. Consecutive high or low pulses do not produce a transition between the pulses, so that pulses of varying duration are produced.

In order to recover a clock from an input signal, it is known to provide clock recovery circuits and methods. See for example, U.S. Pat. No. 5,671,258 to Burns et al. entitled "Clock Recovery Circuit and Receiver Using Same", and U.S. Pat. No. 5,689,692 to MacTaggart et al. entitled "Method and Apparatus for Decoding an Encoded NRZ Signal".

Clock recovery can become complicated for variable frequency input data. For example, when using Asynchronous Transfer Mode (ATM) data transmission formats, data may be transmitted at either 32 megabits per second (Mbps) or 64 Mbps. Since ATM data may include an extra bit for every four consecutive zero bits, these transmission rates generally correspond to effective data rates of about 25 Mbps and about 50 Mbps respectively.

Clock recovery circuits and methods often include a phase locked loop to lock onto a clock frequency. As is well known to those having skill in the art, a phase locked loop generally includes a reference clock or oscillator. Accordingly, when recovering clock signals from multiple frequency input data, multiple phase locked loops and multiple reference clocks may be provided. In an integrated circuit with multiple input data ports, the proliferation of multiple phase locked loops and multiple reference clocks may unduly complicate the integrated circuit.

SUMMARY OF THE INVENTION

It is therefore an object of the present invention to provide circuits and methods that can recover a clock from an input data signal.

It is another object of the invention to provide clock recovery circuits and methods that can recover a clock from an input signal of variable frequency.

It is yet another object of the present invention to provide multiple frequency input signal clock recovery circuits and methods that do not require separate phase locked loops and reference oscillators for each of the multiple frequencies.

These and other objects are provided according to the present invention by clock recovery circuits and methods that include a first phase locked loop that generates a control signal in response to a reference clock. A pulse generating and delaying circuit is responsive to the input data signal to generate from the input data signal pulses of predetermined width that are delayed by a predetermined delay. A second phase locked loop is responsive to the control signal, to the pulse generating and delaying circuit and to a mode signal, to generate a clock signal from the input data signal. Accordingly, only the first phase locked loop need include a reference clock. Cost and/or complexity can therefore be reduced.

Moreover, in an integrated circuit that includes multiple data ports, only the pulse generating and delaying circuit and the second phase locked loop may need to be duplicated for each data port, to allow each data port to operate at a frequency that is independent of the other data ports. A common first phase locked loop, including a common reference clock, may provide a common control signal to all data ports. By using a common first phase locked loop, greater frequency uniformity of the clock that is generated for each of the ports may be obtained. Moreover, the integrated circuit area that is consumed by the clock recovery circuits may be reduced.

Clock recovery circuits and methods according to the present invention, recover a clock from an input signal that is received at a first frequency or at a second frequency, in response to a mode signal that indicates whether the first or second frequency is received. A first phase locked loop generates a control signal in response to a reference clock. A pulse generating and delaying circuit is responsive to the input data signal and to the mode signal, to generate from the input data signal pulses of predetermined width that are delayed by a predetermined delay. At least one of the predetermined width and the predetermined delay is a function of the mode signal. A second phase locked loop is responsive to the control signal and to the pulse generating circuit, to generate a clock signal from the input data signal.

The second phase locked loop preferably includes a phase detector that is responsive to the pulse generating and delaying circuit, and a controlled oscillator that is responsive to the phase detector and to the first phase locked loop. A variable frequency divider is responsive to the controlled oscillator and to the mode signal, to divide the output of the controlled oscillator by a first value or by a second value in response to the mode signal. The phase detector is also responsive to the variable frequency divider. The pulse generating and delaying circuit is also preferably responsive to the control signal.

The pulse generating and delaying circuit may include a pulse generator and a variable delay circuit, both of which are responsive to the mode signal. More specifically, the pulse generator is responsive to the input data signal and to the mode signal, to generate a pulse of pulse width that is a function of the mode signal, for each transition of the input data signal. A variable delay circuit is responsive to the pulse generator and to the mode signal, to delay the pulses by a delay that is a function of the mode signal. The phase detector is responsive to the variable delay circuit.

According to another aspect of the invention, only the variable delay circuit need be responsive to the mode signal. Accordingly, the pulse generating and delaying circuit can include a pulse generator that is responsive to the input data signal, to generate a pulse of fixed pulse width for each transition of the input data signal. A variable delay circuit is responsive to the pulse generator and to the mode signal to delay the pulses by a delay that is a function of the mode signal. The phase detector is responsive to the variable delay circuit.

In the above aspects, a gate may also be included that is responsive to the pulse generator and to the variable frequency divider, to gate the variable frequency divider by the pulse. The phase detector is responsive to the variable divider as gated by the gate.

Clock recovery circuits and methods according to the invention may be used in a data receiver including a clocked flip-flop having a data input and a clock input. The data input is responsive to the input data signal and the clock input is responsive to the clock signal that is generated by the clock recovery circuits or methods. The data signal is thereby clocked. Accordingly, multiple frequency input data may be clocked using two phase locked loops and a pulse generating and delaying circuit.

Only one reference clock need be used, and this reference clock need not be replicated for multiple data ports that operate at multiple frequencies. Low cost and/or high performance clock recovery circuits and methods may thereby be provided.

BRIEF DESCRIPTION OF THE DRAWINGS

FIG. 1 is a block diagram of data receivers according to the present invention.

FIG. 2 is a timing diagram for the data receivers of FIG. 1.

FIG. 4 is a timing diagram for the clock recovery circuits and methods of FIG. 3.

DETAILED DESCRIPTION OF PREFERRED EMBODIMENTS

Figure 3:
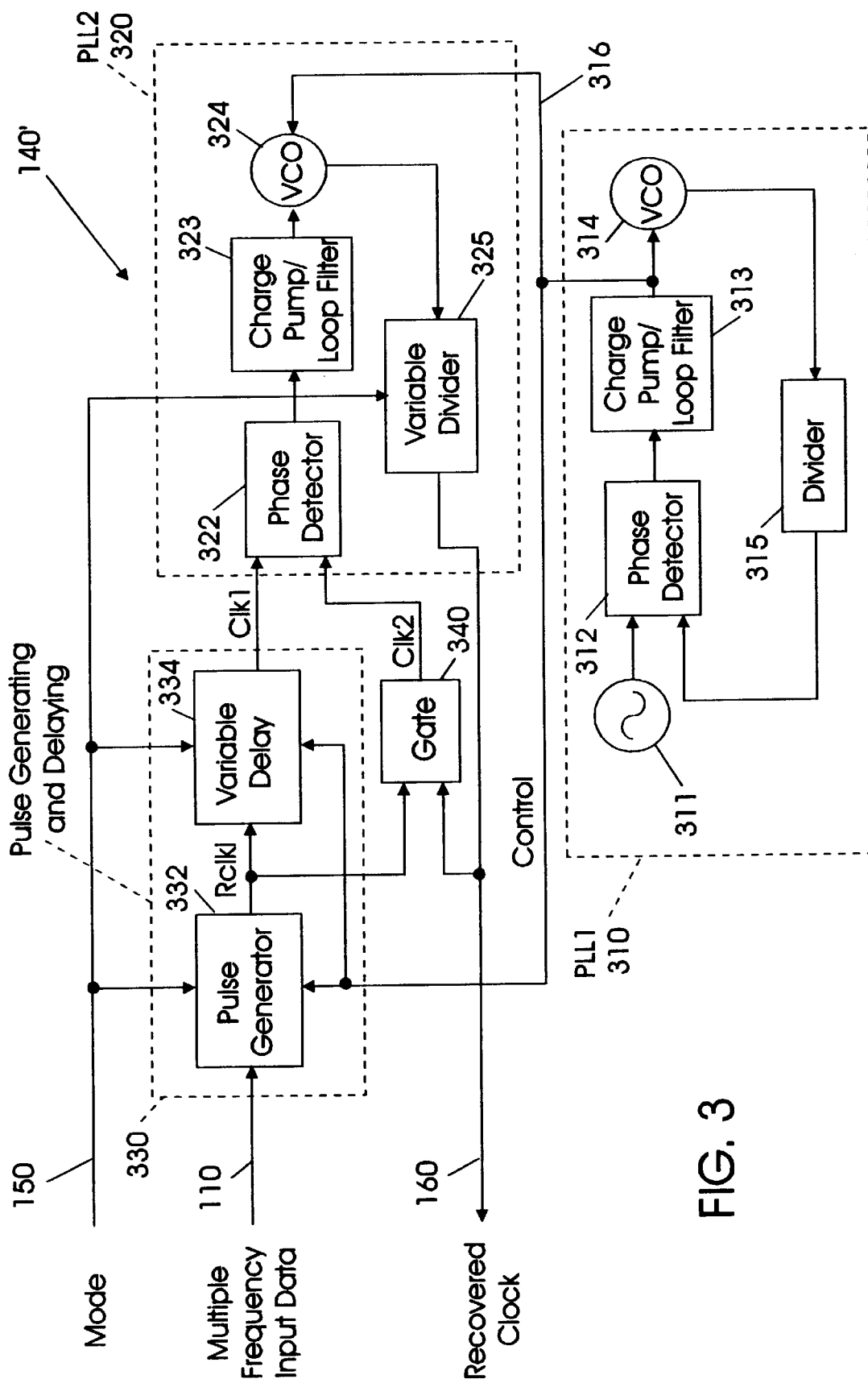
FIG. 3 is a block diagram of clock recovery circuits and methods according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Referring now to FIG. 1, a data receiver that uses clock recovery circuits and methods according to the invention is illustrated. As shown, data receiver 100 is responsive to multiple frequency input data 110, including but not limited to ATM data that is received at 25 Mbps or 50 Mbps, to produce output data 120. Data receiver 100 includes a D-type flip-flop 130 that includes a D input and a clock input (CLK). The multiple frequency input data 110 is coupled to the D input. A clock recovery circuit 140 is responsive to a mode signal 150, to recover a clock from the multiple frequency input data 110 and provide the recovered clock 160 to the clock input of the D flip-flop 130.

FIG. 2 is a timing diagram illustrating multiple frequency input data 110 and the recovered clock 160 of FIG. 1. As shown in FIG. 2, the multiple frequency input data 110 may have a bit period of 31 nanoseconds or 15 nanoseconds, depending upon the frequency. The recovered clock is timed so that a positive going transition takes place at the mid-portion of each pulse of the multiple frequency input data, so that the data can be sampled appropriately.

Referring now to FIG. 3, a first aspect of clock recovery circuits and methods according to the invention will be described. As shown in FIG. 3, clock recovery circuit 140' includes three main elements: a first phase locked loop (PLL1) 310, a second phase locked loop (PLL2) 320 and a pulse generating and delaying circuit 330. In general, the first phase locked loop 310 generates a control signal 316 in response to a reference clock 311. Pulse generating and delaying circuit 330 is responsive to the multiple frequency input data signal 110 and to a mode signal 150, to generate from the input data signal pulses of predetermined width that are delayed by a predetermined delay. As shown in FIG. 3, both the predetermined width and the predetermined delay are a function of the mode signal. Second phase locked loop 320 is responsive to the control signal 316 from the first phase locked loop 310 and to the pulse generating and delaying circuit 330, to generate a recovered clock signal 160. Accordingly, the first phase locked loop 310 is independent of the mode signal and the second phase locked loop 320 and the pulse generating and delaying circuit 330 are both responsive to the mode signal 150.

A detailed description of clock recovery circuit 140' of FIG. 3 will now be provided. However, it will be understood that each of the individual blocks of clock recovery circuit 140' are conventional and the internal design of each block is well known to those having skill in the art. Accordingly, a description of the functionality of each block and of the interconnection of the blocks to provide a clock recovery circuit 140' will be provided.

Referring again to FIG. 3, first phase locked loop 310 includes a reference clock 311 which may include a crystal oscillator and supporting circuitry, and a first phase detector 312. A first charge pump and loop filter 313 is responsive to the output of the first phase detector 312. The output of the first charge pump and loop filter 313 is supplied as the control input of a first controlled oscillator, such as a first Voltage Controlled Oscillator (VCO) 314. The output of first VCO 314 is applied to a divider 315. The output of the divider is fed back as an input of first phase detector 312. When clocking ATM data of 25 Mbps or 50 Mbps, the reference clock 311 may be set at 32 MHz and the divider 315 may be set to divide by four, so that the first VCO 314 oscillates at 128 MHz. The output of first charge pump and loop filter 313, which is applied to the control input of the first VCO, produces a control signal 316.

Continuing with the description of FIG. 3, second phase locked loop 320 includes a second phase detector 322, the output of which is applied to a second charge pump and loop filter 323. The output of the second charge pump and loop filter 323 is applied as a control input to a second controlled oscillator such as a second VCO 324. The control signal 316 is also applied as a control input to second VCO 324. Accordingly, control signal 316 from the first phase locked loop 310 may be regarded as a "coarse tuning" input to second VCO 324 and the output of second charge pump and loop filter 323 may be regarded as a "fine tuning" control input for second VCO 324. The output of second VCO 324 is applied to a variable divider 325. The output of the variable divider 325 provides the recovered clock 160. The variable divider is responsive to mode signal 150. For example, the mode signal 150 may set the variable divider 325 to divide by four when clocking 25 Mbps data, and to divide by two when clocking 50 Mbps data.

Still continuing with the description of FIG. 3, pulse generating and delaying circuit 330 includes a pulse generator 332 that is responsive to the multiple frequency input data 110 and to the mode signal 150, to generate a pulse having a pulse width that is a function of the mode signal, for each transition of the input data signal. A variable delay circuit 334 is responsive to the pulse generator 332 and to the mode signal 150, to delay the pulses by a delay that is the function of the mode signal. Thus, for example, the pulse generator may be set for 32 MHz output or 64 MHz output in response to the mode signal 150, and the variable delay can provide twice the delay for 32 MHz operation as for 64 MHz operation. The output of the variable delay 324 is applied as an input to second phase detector 322 in second phase locked loop 320. In FIG. 3, both the pulse generator 332 and the variable delay 334 are also responsive to the control signal 316 from the first phase locked loop 310.

Finally, clock recovery circuit 140' also includes a gate 340. As shown, the gate 340 is responsive to the pulse generator 332 and to the variable divider 325. Gate 340 gates the variable frequency divider by the pulses from pulse generator 332. The phase detector 322 is responsive to the variable frequency divider 325, as gated by the gate 340.

Operation of the clock recovery circuit 140' of FIG. 3 will now be described with reference to the timing diagram of FIG. 4. As shown in FIG. 4, multiple frequency input data 110 can use a Non-Return to Zero (NRZ) format, so that when multiple adjacent bits of the same value are present, there are no data transitions. The output of pulse generator 332, designated Rclki, is shown to generate a pulse for each transition of the multiple frequency input data 110. The width of the pulse is selected as a function of the frequency of the input data. The width of the pulse is selected so that data can be clocked near the middle of an input data period, to obtain accurate sensing of the input data. The variable delay 334 operates on the output of pulse generator 332 (Rclki) to generate a delayed version of the pulses, designated as Clk1. Accordingly, as shown in FIG. 4, Clk1 is delayed by a predetermined amount compared to Rclki. The amount of delay is a function of the mode signal, and is preferably selected so that the positive going transition in the signal Clk1 is near the center of a bit of the multiple frequency input data 110. Thus, the D-type flip-flop 130 of FIG. 1 can use a positive going transition in the recovered clock to clock the input data 110.

As shown in FIG. 4, the output of variable delay Clk1 only provides positive going transitions for bits that include a transition. Thus, for example, the third and fourth bits of multiple frequency input data 110 which are both zero, do not include a transition in waveform Clk1. However, waveform Clk1 is applied to the second phase locked loop 320. Accordingly, the output of variable divider 325 produces a recovered clock signal 160 that has a positive going transition near the center of every bit of the multiple frequency input data 110. Second phase locked loop 320 maintains lock on the recovered clock signal 160.

It will be understood that absence of transitions in the multiple frequency input data may cause the second phase locked loop 320 to lose its lock. Gate 340 reduces and preferably prevents loss of lock by eliminating control pulses to second VCO 324, thus providing an output signal Clk2 that maintains no phase difference with signal Clk1 even in the absence of a pulse. Accordingly, erroneous control pulses to VCO 324 are reduced and preferably eliminated.

As shown in FIG. 3, only one reference clock 311 need be provided to operate the clock recovery circuit 140' with multiple frequency input data 110. As will be described in connection with FIG. 8, for a multiple data port integrated circuit, a single first (master) phase locked loop 310 may be provided, that drives multiple second (slave) phase locked loops 320 and multiple pulse generating and delaying circuits 330, to provide independently variable frequencies at each port. Accordingly, high performance and/or low cost multiple frequency clock recovery may be provided.

Figures 5, 5A:
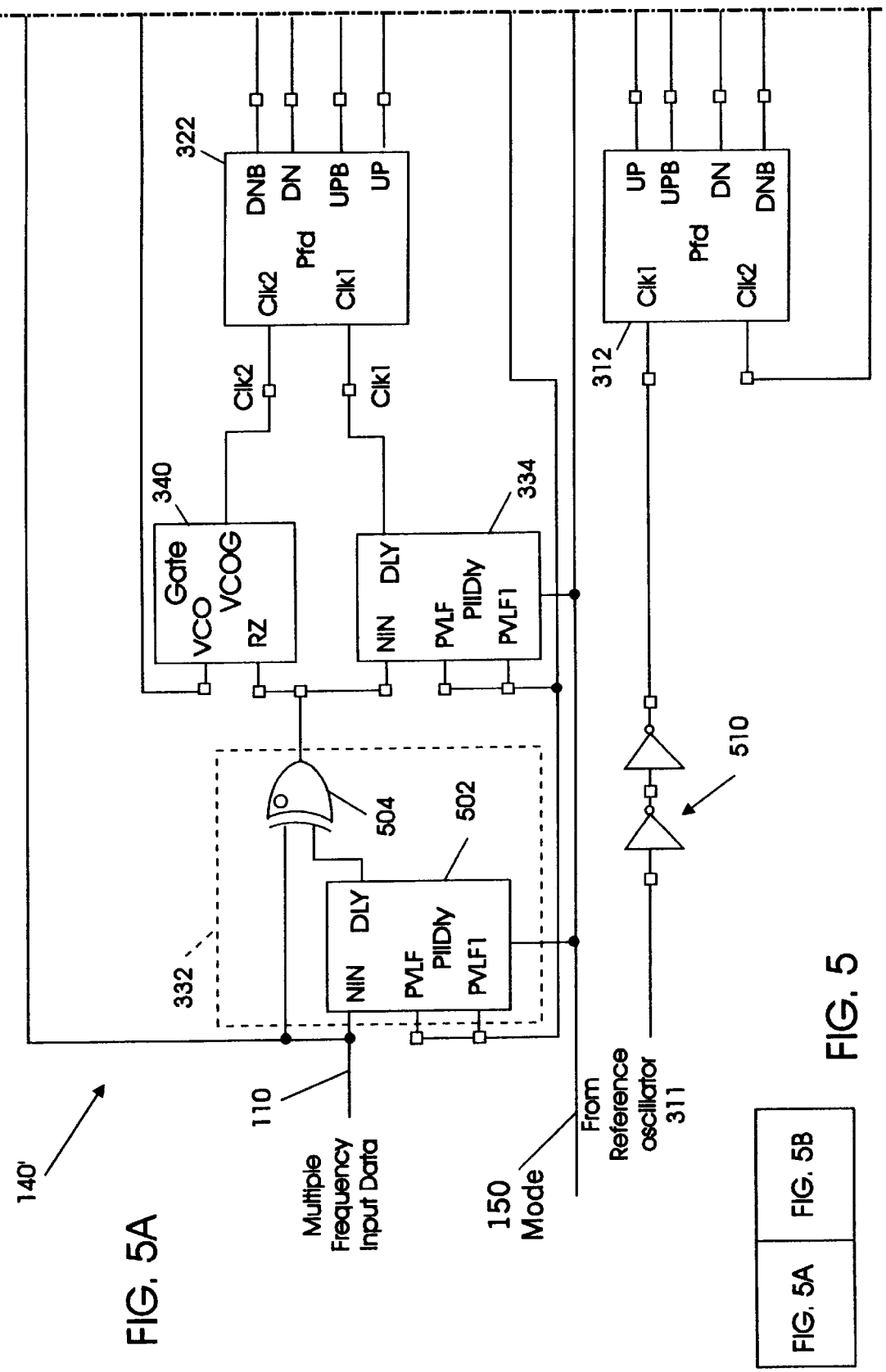
FIG. 5 is a schematic diagram of clock recovery circuits and methods of FIG. 3.
Figure 5B:
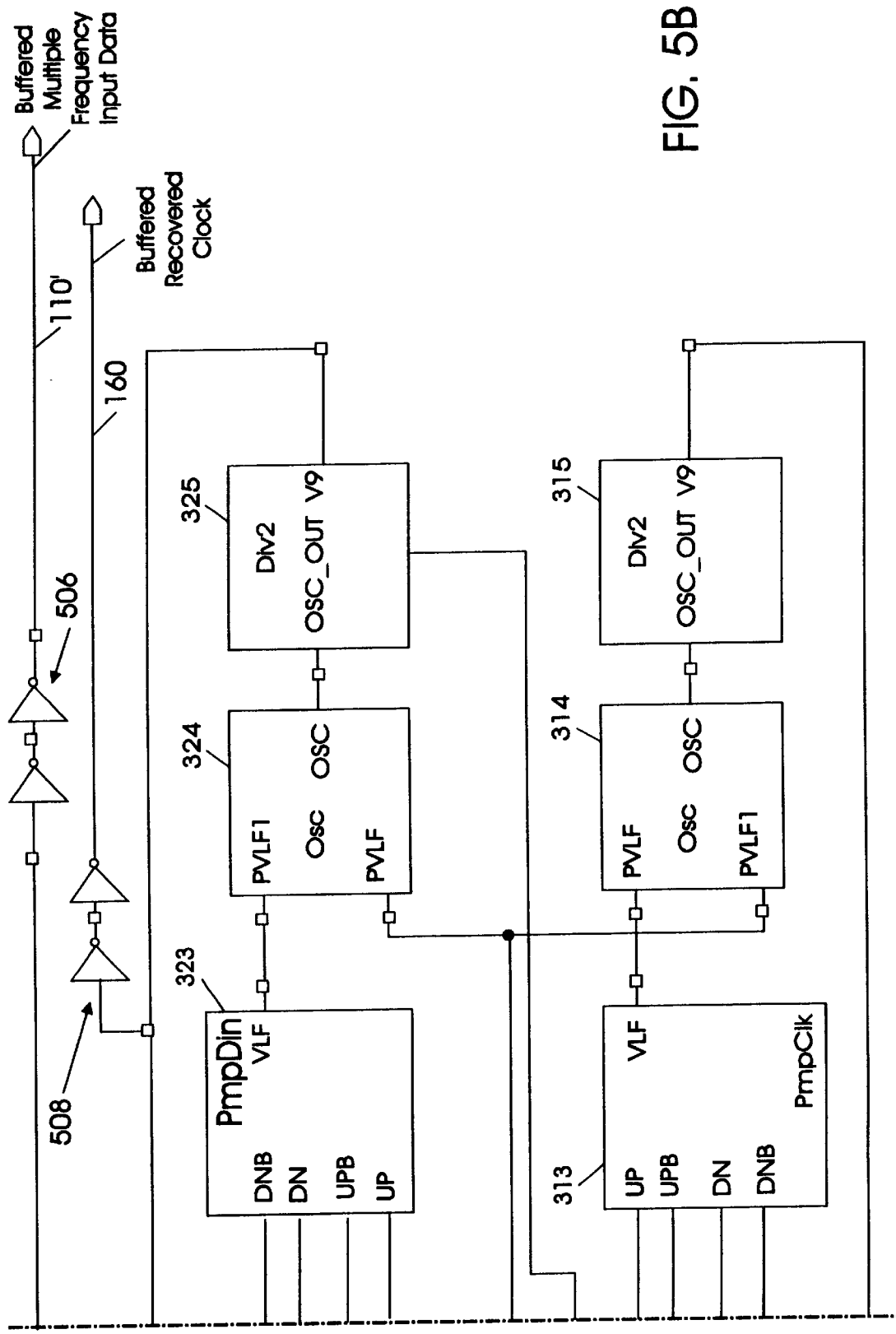

FIG. 5 is a schematic diagram of a clock recovery circuit 140' of FIG. 3. As shown, pulse generator 332 may be implemented using a delay block 502 and an exclusive XOR gate 504. A buffer 506 may be used to buffer multiple frequency input data 110 to provide buffered multiple frequency input data 110' that can be applied to a D-type flip-flop, as shown in FIG. 1. A buffer 508 may also be used to buffer the recovered clock 160 to provide a buffered recovered clock 160'. Buffers 510 may be used to buffer the signal from the reference oscillator 311 that is applied to the first phase detector 312.

As shown in FIG. 5, both the pulse generator 332 and the variable delay 334 may use variable delay blocks. In an integrated circuit, a variable delay block is often implemented by a large number of delay stages, such as shift registers. Each stage provides a predetermined delay, so that the entire delay block is capable of providing a delay which is the sum of the delay of all of the stages. Thus, if each stage contributes a delay $D_s$ and there are n stages, the total delay of the delay block is given by $n \cdot D_s$. In order to provide a variable delay, a variable number of stages is used in the delay block. Unfortunately, the need to provide appreciable delay may unduly increase the number of stages in the delay block. These large stage delay blocks may consume excessive area in an integrated circuit. According to another aspect of the present invention, a large delay block may be eliminated by providing a fixed pulse width.

Figure 6:
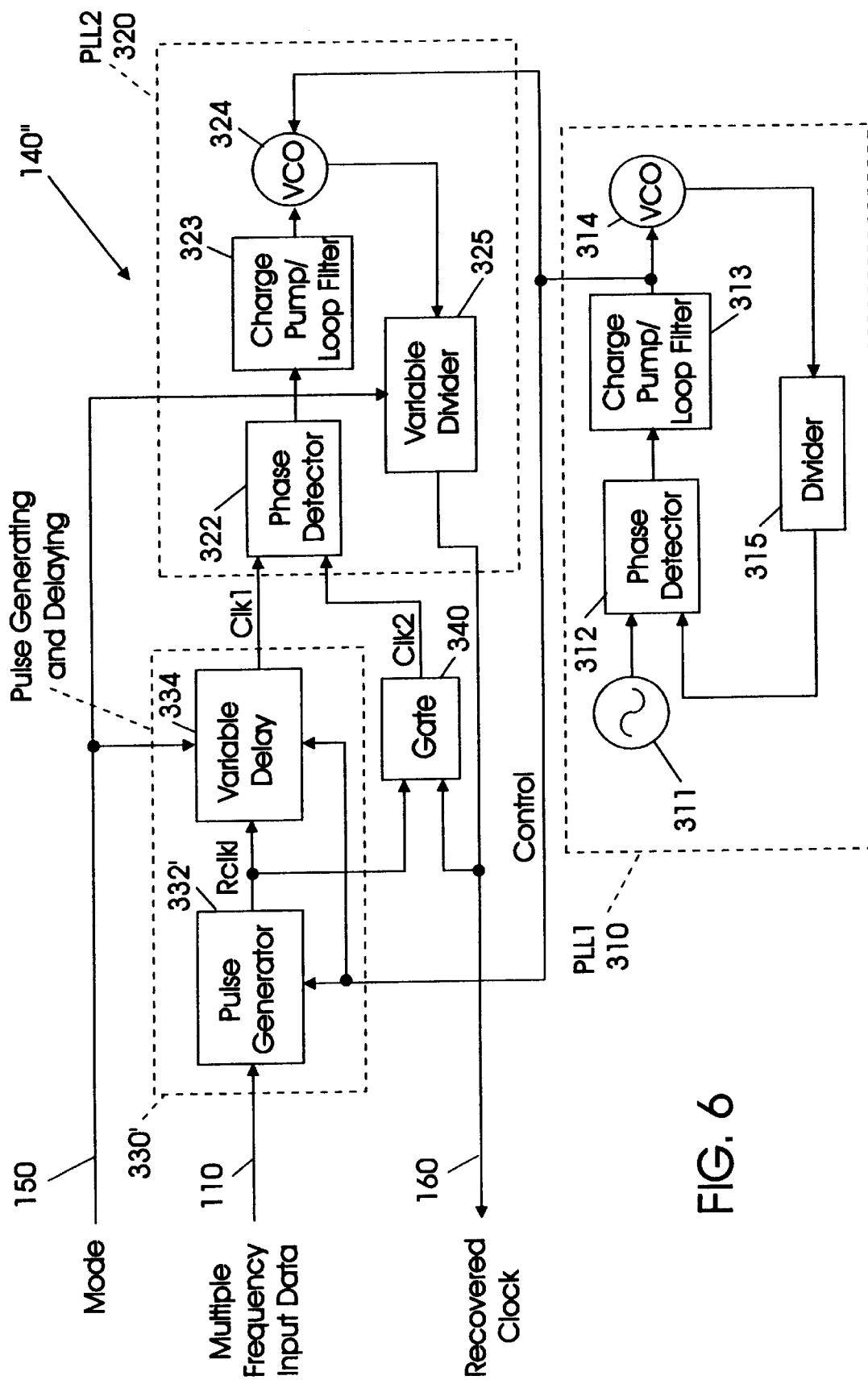
FIG. 6 is a block diagram of clock recovery circuits and methods according to another aspect of the present invention.

FIG. 6 illustrates a block diagram of a clock recovery circuit 140", wherein a pulse generating and delaying circuit 330' includes a pulse generator 332' that generates a pulse of fixed width, and a variable delay 334 that generates a variable delay. Since fixed pulse generator 332' is fixed, it no longer needs to be responsive to mode signal 150.

Figure 7:
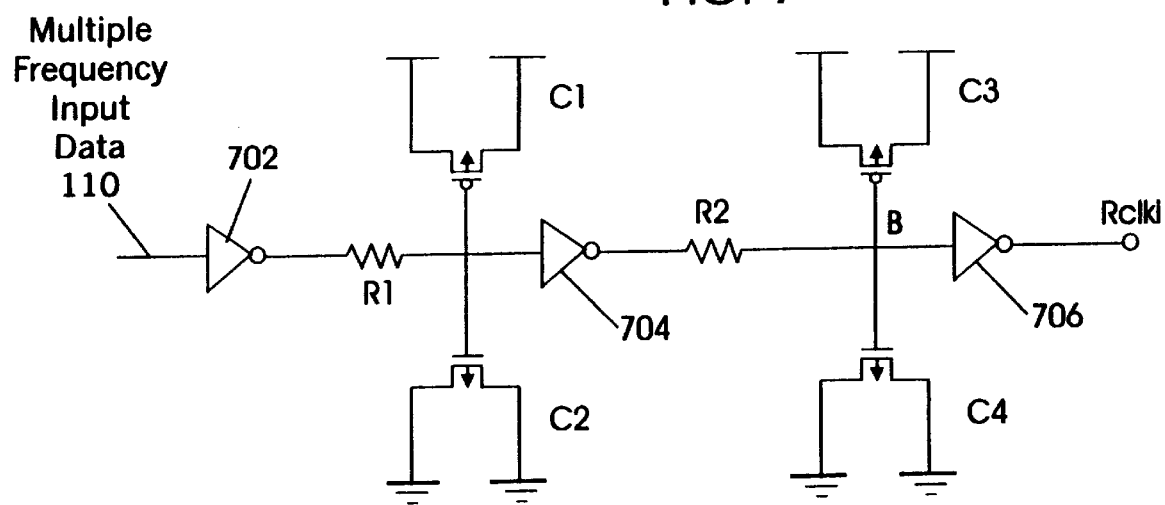
FIG. 7 is a schematic diagram of a fixed pulse generator of FIG. 6.

FIG. 7 is a schematic diagram of an embodiment of a fixed pulse generator 332' of FIG. 6. As shown, fixed pulse generator 332' may be implemented using resistors and capacitors to produce a desired delay using conventional resistor-capacitor (RC) time constants. In FIG. 7, two stages are provided. The first stage uses resistor R1 and capacitors C1 and C2. The second stage uses resistor R2 and capacitors C3 and C4. Buffers 702, 704 and 706 are also used. The circuit of FIG. 7 can take up much less integrated circuit area than a pulse generator having many stages.

Fixed pulse widths may be employed as shown in FIG. 6, rather than variable pulse widths as shown in FIG. 3, by selecting a pulse width that will allow the recovered clock to make a positive going transition in the middle of pulses of all the multiple frequency input data. Stated differently, the clock need not be sampled at the exact center of a bit of the input data, as long as the clock transition avoids the transitions of the input data signal.

More specifically, when operating at multiple frequencies, the pulse width of the pulse generator output need not be 50% of the operating frequency, as long as the pulse width does not exceed 50% of the period of the highest operating frequency of the clock recovery circuit. If the pulse width of the pulses generated by the pulse generator substantially exceeds 50% of the period of the highest operating frequency, it will not generate a pulse for every input data transition. Furthermore, because phase detection may be accomplished at the leading edge of the pulse, all that the delay of the pulse need accomplish is to place the leading edge of the pulse 25% through the data duration. This will have the same effect as centering a pulse of 50% duration. Because the actual data recovery clock has its own duty cycle independent of the pulse width, a 50% duty cycle may be achieved without a 50% duty cycle pulse.

Accordingly, a fixed duration pulse may be utilized where the duration of the pulse is 50% of the period of the highest operating frequency. Thus, by appropriately choosing a fixed pulse width, the same pulses may be used to generate signal C1k1 for multiple frequency input data. Simplified pulse generators may be provided that are independent of the mode signal 150. Thus, only the variable delay 334 and variable divider 325 need be coupled to the mode signal 150, as shown in FIG. 6.

Figure 8:
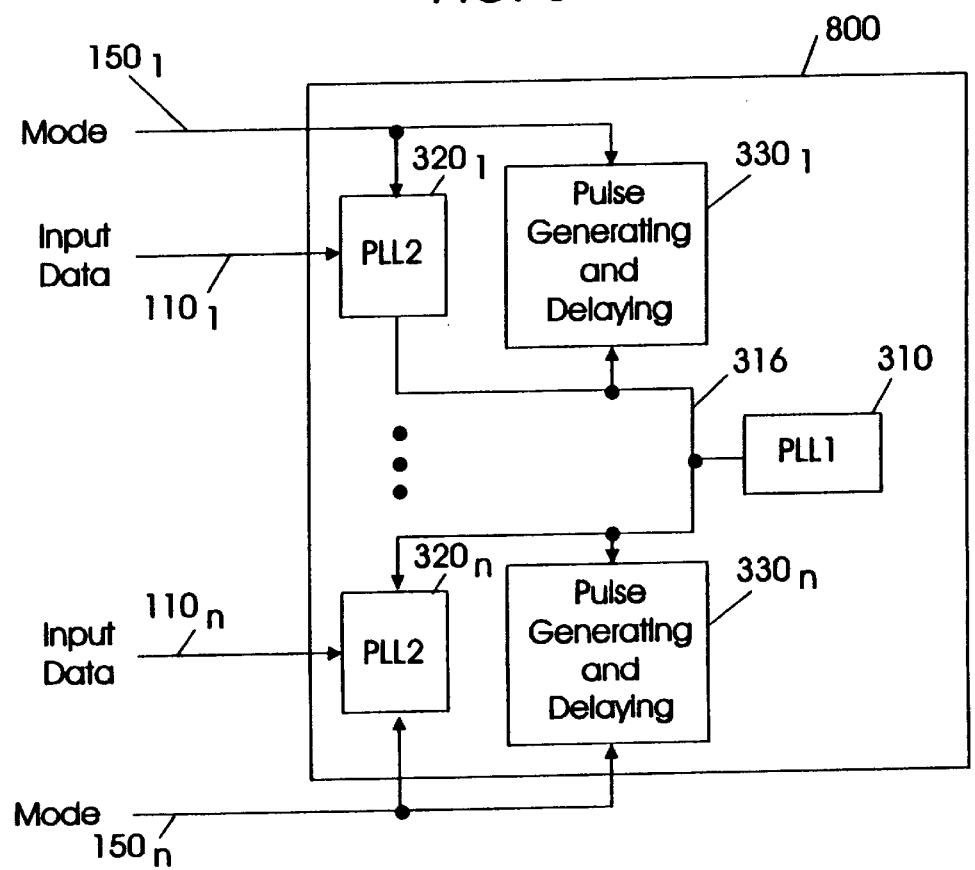
FIG. 8 is a block diagram of integrated circuits according to the present invention.

As shown in FIG. 8, an integrated circuit 800 can include a first (master) phase locked loop 310 that provides a control signal 316 to multiple second (slave) phase locked loops 320i–320n and multiple pulse generating and delaying circuits 330$_1$–330$_n$. A corresponding plurality of input data ports 110$_1$–110$_n$ and mode signals 150$_1$–150$_n$ may be provided. Accordingly, a single first phase locked loop 310 may be used to provide a control signal 316 to multiple ports, each of which can independently receive input data of varying frequency.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A clock recovery circuit that recovers a clock from an input data signal that is received at a first frequency or at a second frequency, in response to a mode signal that indicates whether the first or second frequency is received, the clock recovery circuit comprising:
   a first phase locked loop that generates a control signal in response to a reference clock;
   a pulse generating and delaying circuit that is responsive to the input data signal and to the mode signal, to generate from the input data signal pulses of predetermined width that is no more than half the period of the input data and that are delayed by a predetermined delay, at least one of the predetermined width that is no more than half the period of the input data and the predetermined delay being a function of the mode signal; and
   a second phase locked loop that is responsive to the control signal and to the pulse generating circuit, to generate a clock signal from the input data signal.

2. A clock recovery circuit that recovers a clock from an input data signal that is received at a first frequency or at a second frequency, in response to a mode signal that indicates whether the first or second frequency is received, the clock recovery circuit comprising:
   a first phase locked loop that generates a control signal in response to a reference clock;
   a pulse generating and delaying circuit that is responsive to the input data signal and to the mode signal, to generate from the input data signal pulses of predetermined width that are delayed by a predetermined delay, at least one of the predetermined width and the predetermined delay being a function of the mode signal; and
   a second phase locked loop that is responsive to the control signal and to the pulse generating circuit, to generate a clock signal from the input data signal;
   wherein the second phase locked loop comprises:
      a phase detector that is responsive to the pulse generating and delaying circuit;
      a controlled oscillator that is responsive to the phase detector and to the first phase locked loop; and
      a variable divider that is responsive to the controlled oscillator and to the mode signal, to divide the output of the controlled oscillator by a first value or by a second value in response to the mode signal, the phase detector also being responsive to the variable divider.

3. A clock recovery circuit that recovers a clock from an input data signal that is received at a first frequency or at a second frequency, in response to a mode signal that indicates whether the first or second frequency is received, the clock recovery circuit comprising:
   a first phase locked loop that generates a control signal in response to a reference clock;
   a pulse generating and delaying circuit that is responsive to the input data signal and to the mode signal, to generate from the input data signal pulses of predetermined width that are delayed by a predetermined delay, at least one of the predetermined width and the predetermined delay being a function of the mode signal; and
   a second phase locked loop that is responsive to the control signal and to the pulse generating circuit, to generate a clock signal from the input data signal;
   wherein the pulse generating and delaying circuit is also responsive to the control signal.

4. A clock recovery circuit according to claim 2 wherein the pulse generating and delaying circuit comprises:
   a pulse generator that is responsive to the input data signal and to the mode signal, to generate a pulse of a pulse width that is a function of the mode signal, for each transition of the input data signal; and
   a variable delay circuit that is responsive to the pulse generator and to the mode signal, to delay the pulses by a delay that is a function of the mode signal;
   the phase detector being responsive to the variable delay circuit.

5. A clock recovery circuit according to claim 2 wherein the pulse generating and delaying circuit comprises:
   a pulse generator that is responsive to the input data signal and to the mode signal, to generate a pulse of a pulse width that is a function of the mode signal, for each transition of the input data signal; and
   a variable delay circuit that is responsive to the pulse generator and to the mode signal, to delay the pulses by a delay that is a function of the mode signal;
   the phase detector being responsive to the variable delay circuit;
   the clock recovery system further comprising a gate that is responsive to the pulse generator and to the variable divider, to gate the variable divider by the pulses, the phase detector being responsive to the variable divider as gated by the gate.

6. A clock recovery circuit according to claim 2 wherein the pulse generating and delaying circuit comprises:
   a pulse generator that is responsive to the input data signal to generate a pulse of a fixed pulse width for each transition of the input data signal; and
   a variable delay circuit that is responsive to the pulse generator and to the mode signal, to delay the pulses by a delay that is a function of the mode signal;

the phase detector being responsive to the variable delay circuit.

7. A clock recovery circuit according to claim 6 further comprising:
a gate that is responsive to the pulse generator and to the variable frequency divider, to gate the variable divider by the pulses, the phase detector being responsive to the variable divider as gated by the gate.

8. A clock recovery circuit that recovers a clock from an input data signal that is received at a first frequency or at a second frequency, in response to a mode signal that indicates whether the first or second frequency is received, the clock recovery circuit comprising:
a first phase locked loop that generates a control signal in response to a reference clock;
a pulse venerating and delaying circuit that is responsive to the input data signal and to the mode signal, to generate from the input data signal pulses of predetermined width that are delayed by a predetermined delay, at least one of the predetermined width and the predetermined delay being a function of the mode signal;
a second phase locked loop that is responsive to the control signal and to the pulse generating circuit, to generate a clock signal from the input data signal; and
a clocked flip-flop including a data input and a clock input, the data input being responsive to the input data signal and the clock input being responsive to the clock signal to thereby clock the data signal.

9. A clock recovery circuit that recovers a clock from an input data signal that is received at a first frequency or at a second frequency, in response to a mode signal that indicates whether the first or second frequency is received, the clock recovery circuit comprising:
a first phase locked loop that generates a control signal in response to a reference clock;
a pulse generating and delaying circuit that is responsive to the input data signal and to the mode signal, to generate from the input data signal pulses of predetermined width that are delayed by a predetermined delay, at least one of the predetermined width and the predetermined delay being a function of the mode signal;
a second phase locked loop that is responsive to the control signal and to the pulse generating circuit, to generate a clock signal from the input data signal;
a second pulse generating and delaying circuit that is responsive to a second input data signal and to a second mode signal, to generate from the second input data signal pulses of predetermined width that are delayed by a predetermined delay, at least one of the predetermined width and the predetermined delay being a function of the second mode signal; and
a third phase locked loop that is responsive to the control signal and to the second pulse generating circuit, to generate a second clock signal from the second input data signal.

10. A clock recovery apparatus that recovers a clock from an input data signal that is received at a first frequency or at a second frequency, in response to a mode signal that indicates whether the first or second frequency is received, the clock recovery apparatus comprising:
a first phase locked loop that generates a control signal in response to a reference clock;
means for generating from the input data signal pulses of predetermined width that is no more than half the period of the input data and that are delayed by a predetermined delay, at least one of the predetermined width that is no more than half the period of the input data and the predetermined delay being a function of the mode signal; and
a second phase locked loop that is responsive to the control signal and to the generating means, to generate a clock signal from the input data signal.

11. A clock recovery apparatus that recovers a clock from an input data signal that is received at a first frequency or at a second frequency, in response to a mode signal that indicates whether the first or second frequency is received, the clock recovery apparatus comprising:
a first phase locked loop that generates a control signal in response to a reference clock;
means for generating from the input data signal pulses of predetermined width that are delayed by a predetermined delay at least one of the predetermined width and the predetermined delay being a function of the mode signal; and
a second phase locked loop that is responsive to the control signal and to the generating means, to generate a clock signal from the input data signal;
wherein the second phase locked loop comprises:
a phase detector that is responsive to the generating means;
a controlled oscillator that is responsive to the phase detector and to the first phase locked loop; and
means for dividing the output of the controlled oscillator by a first value or by a second value in response to the mode signal, the phase detector also being responsive to the dividing means.

12. A clock recovery apparatus that recovers a clock from an input data signal that is received at a first frequency or at a second frequency, in response to a mode signal that indicates whether the first or second frequency is received, the clock recovery apparatus comprising:
a first phase locked loop that generates a control signal in response to a reference clock;
means for generating from the input data signal pulses of predetermined width that are delayed by a predetermined delay, at least one of the predetermined width and the predetermined delay being a function of the mode signal; and
a second phase locked loop that is responsive to the control signal and to the generating means, to generate a clock signal from the input data signal;
wherein the generating means is also responsive to the control signal.

13. A clock recovery apparatus according to claim 11 wherein the generating means comprises:
means for generating a pulse of a pulse width that is a function of the mode signal, for each transition of the input data signal; and
means for delaying the pulses by a delay that is a function of the mode signal;
the phase detector being responsive to the delaying means.

14. A clock recovery apparatus according to claim 11 wherein the generating means comprises:
means for generating a pulse of a pulse width that is a function of the mode signal, for each transition of the input data signal; and
means for delaying the pulses by a delay that is a function of the mode signal;

the phase detector being responsive to the delaying means;

the clock recovery apparatus further comprising means for gating the dividing means by the pulses, the phase detector being responsive to the dividing means as gated by the gating means.

15. A clock recovery apparatus according to claim 11 wherein the generating means comprises:

means for generating a pulse of a fixed pulse width for each transition of the input data signal; and means for delaying the pulses by a delay that is a function of the mode signal;

the phase detector being responsive to the delaying means.

16. A clock recovery apparatus according to claim 15 further comprising:

means for gating the dividing means by the pulses, the phase detector being responsive to the dividing means as gated by the gating means.

17. A clock recovery apparatus that recovers a clock from an input data signal that is received at a first frequency or at a second frequency, in response to a mode signal that indicates whether the first or second frequency is received, the clock recovery apparatus comprising:

a first phase locked loop that generates a control signal in response to a reference clock;

means for generating from the input data signal pulses of predetermined width that are delayed by a predetermined delay, at least one of the predetermined width and the predetermined delay being a function of the mode signal;

a second phase locked loop that is responsive to the control signal and to the generating means, to generate a clock signal from the input data signal; and a clocked flip-flop including a data input and a clock input, the data input being responsive to the input data signal and the clock input being responsive to the clock signal to thereby clock the data signal.

18. A clock recovery apparatus that recovers a clock from an input data signal that is received at a first frequency or at a second frequency, in response to a mode signal that indicates whether the first or second frequency is received, the clock recovery apparatus comprising:

a first phase locked loop that generates a control signal in response to a reference clock;

means for generating from the input data signal pulses of predetermined width that are delayed by a predetermined delay, at least one of the predetermined width and the predetermined delay being a function of the mode signal;

a second phase locked loop that is responsive to the control signal and to the generating means, to generate a clock signal from the input data signal;

second means for generating from a second input data signal pulses of predetermined width that are delayed by a predetermined delay, at least one of the predetermined width and the predetermined delay being a function of a second mode signal; and a third phase locked loop that is responsive to the control signal and to the second generating means, to generate a second clock signal from the second input data signal.

19. A multiple data port integrated circuit that recovers a plurality of clocks from a corresponding plurality of input data signals that are received at a first frequency or at a second frequency, in response to a corresponding plurality of mode signals that indicate whether the corresponding plurality of input data signals are received at the first or second frequency, the integrated circuit comprising:

a master phase locked loop that generates a control signal in response to a reference clock;

a corresponding plurality of pulse generating and delaying circuits, each of which is responsive to a corresponding input data signal to generate from the corresponding input data signal pulses of predetermined width that are delayed by a predetermined delay; and a corresponding plurality of slave phase locked loops, each of which is responsive to the control signal, to the corresponding pulse generating and delaying circuit and to the corresponding mode signal, to generate a corresponding clock signal from the corresponding input data signal.

20. A multiple data port integrated circuit according to claim 19 wherein the corresponding slave phase locked loops each comprise:

a phase detector that is responsive to the corresponding pulse generating and delaying circuit;

a controlled oscillator that is responsive to the corresponding phase detector and to the master phase locked loop; and a variable divider that is responsive to the corresponding controlled oscillator and to the corresponding mode signal, to divide the output of the corresponding controlled oscillator by a first value or by a second value in response to the corresponding mode signal, the phase detector also being responsive to the variable divider.

21. A multiple data port integrated circuit according to claim 19 wherein the pulse generating and delaying circuits are also responsive to the control signal.

22. A multiple data port integrated circuit according to claim 20 further comprising:

a corresponding plurality of gates, each of which is responsive to the corresponding pulse generator and to the corresponding variable divider, to gate the corresponding variable divider by the pulses, the corresponding phase detector being responsive to the corresponding variable divider as gated by the corresponding gate.

23. A multiple data port integrated circuit according to claim 19 further comprising:

a corresponding plurality of clocked flip-flops including a data input and a clock input, the data input being responsive to the corresponding input data signal and the clock input being responsive to the corresponding clock signal to thereby clock the data signal.

24. A clock recovery method that recovers a clock from an input data signal that is received at a first frequency or at a second frequency, in response to a mode signal that indicates whether the first or second frequency is received, the clock recovery method comprising the steps of:

generating a control signal in response to a reference clock and independent of the mode signal;

generating from the input data signal pulses of predetermined width that is no more than half the period of the input data and that are delayed by a predetermined delay; and generating a clock signal from the input data signal, in response to the control signal, the pulses and the mode signal.

25. A clock recovery method that recovers a clock from an input data signal that is received at a first frequency or at a second frequency, in response to a mode signal that indicates whether the first or second frequency is received, the clock recovery method comprising the steps of:

generating a control signal in response to a reference clock;

generating from the input data signal pulses of predetermined width that are delayed by a predetermined delay; and generating a clock signal from the input data signal, in response to the control signal, the pulses and the mode signal;

wherein the pulse generating step is also responsive to the control signal.

26. A clock recovery method that recovers a clock from an input data signal that is received at a first frequency or at a second frequency, in response to a mode signal that indicates whether the first or second frequency is received, the clock recovery method comprising the steps of:

generating a control signal in response to a reference clock;

generating from the input data signal pulses of predetermined width that are delayed by a predetermined delay;

generating a clock signal from the input data signal, in response to the control signal, the pulses and the mode signal;

generating from a second input data signal second pulses of predetermined width that are delayed by a predetermined delay; and generating a second clock signal from a second input data signal, in response to the control signal, the second pulses and a second mode signal.

27. The clock recovery circuit of claim 1 wherein the width of the pulses of predetermined width does not exceed fifty percent of the period of a higher of the first or second frequency at which the input data signal is received.

28. The clock recovery circuit of claim 10 wherein the width of the pulses of predetermined width does not exceed fifty percent of the period of a higher of the first or second frequency at which the input data signal is received.

29. The clock recovery circuit of claim 24 wherein the width of the pulses of predetermined width does not exceed fifty percent of the period of a higher of the first or second frequency at which the input data signal is received.

* * * * *